(12) United States Patent
Ryu

(10) Patent No.: US 8,098,528 B2
(45) Date of Patent: Jan. 17, 2012

(54) VOLTAGE GENERATION CIRCUIT AND NONVOLATILE MEMORY DEVICE INCLUDING THE SAME

(75) Inventor: Je Il Ryu, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 202 days.

(21) Appl. No.: 12/493,272

(22) Filed: Jun. 29, 2009

(65) Prior Publication Data

US 2010/0054074 A1 Mar. 4, 2010

(30) Foreign Application Priority Data

Sep. 4, 2008 (KR) .................. 10-2008-0087112

(51) Int. Cl.
*G11C 11/34* (2006.01)
(52) U.S. Cl. ............... 365/185.25; 365/233.11
(58) Field of Classification Search ............. 365/185.25, 365/233.11
See application file for complete search history.

(56) References Cited

U.S. PATENT DOCUMENTS

2008/0031078 A1* 2/2008 Kang .................. 365/233.1

FOREIGN PATENT DOCUMENTS

| KR | 1020000075834 A | 12/2000 |
| KR | 1020040068929 A | 8/2004 |
| KR | 100466198 B1 | 1/2005 |

OTHER PUBLICATIONS

Notice of Preliminary Rejection issued from Korean Intellectual Property Office on Mar. 31, 2010.

* cited by examiner

*Primary Examiner* — Hoai V Ho
*Assistant Examiner* — Jason Lappas
(74) *Attorney, Agent, or Firm* — IP & T Group LLP (57) ABSTRACT

A high voltage generation circuit includes a clock logic unit configured to generate a switch clock signal and a pump clock signal, that has a varying frequency, in response to an input signal, a high voltage unit configured to generate a high voltage in response to the pump clock signal, a high voltage switch configured to output a selection signal in response to the switch clock signal, and a switching element configured to transfer the high voltage, generated by the high voltage unit, to an output node in response to the selection signal.

20 Claims, 5 Drawing Sheets

VOLTAGE GENERATION CIRCUIT AND NONVOLATILE MEMORY DEVICE INCLUDING THE SAME

CROSS-REFERENCE TO RELATED APPLICATION

Priority to Korean patent application number 10-2008-0087112 filed on Sep. 4, 2008, the entire disclosure of which is incorporated by reference herein, is claimed.

BACKGROUND

An embodiment relates to a voltage generation circuit and, more particularly, to a voltage generation circuit which is capable of preventing unnecessary current consumption and speeding up the operating speed by controlling a clock frequency upon operation, and a nonvolatile memory device including the same.

In a nonvolatile memory device (in particular, a flash memory device that can be electrically erased and programmed), when an erase operation for erasing data stored in a memory cell and a program operation for storing data in a memory cell are performed, Fowler-Nordheim (F-N) tunneling and a hot electron injection method are used.

A flash memory device operating at a relatively low power source voltage generally includes a voltage supply circuit configured to generate a high voltage within a chip. The voltage supply circuit is configured to pump an input low voltage to a high voltage using a voltage pump circuit and output a pumped voltage.

Figure 1:
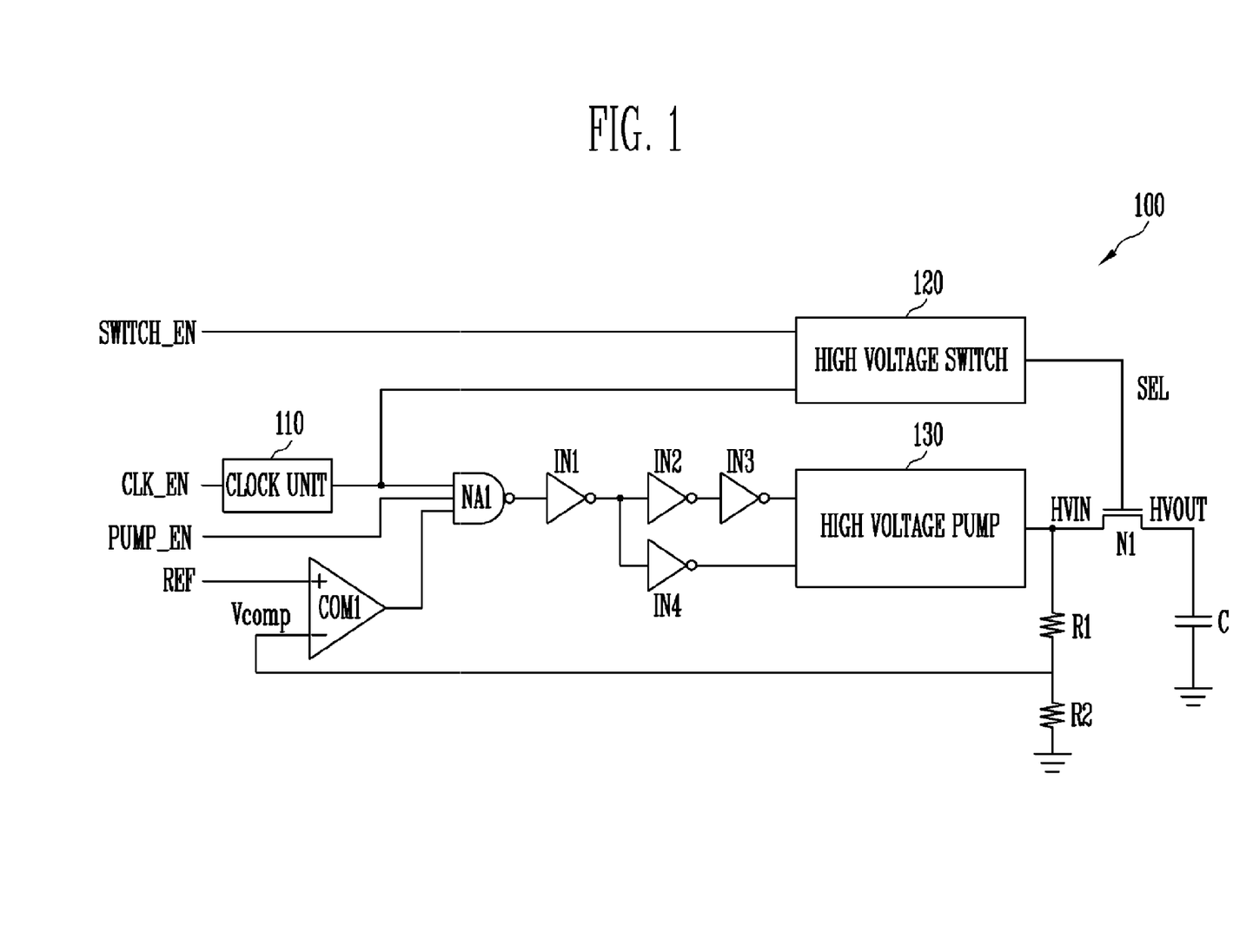
FIG. 1 shows the voltage supply circuit of nonvolatile memory device.

FIG. 1 shows the voltage supply circuit of a nonvolatile memory device.

Referring to FIG. 1, the voltage supply circuit 100 includes a clock unit 110, a high voltage switch 120, and a high voltage pump 130. The voltage supply circuit 100 further includes a first comparator COM1, a NAND gate NA1, first to fourth inverters IN1 to IN4, an NMOS transistor N1, first and second resistors R1 and R2, and a capacitor C.

The clock unit 110 generates a clock in response to a clock enable signal CLK_EN. The clock generated by the clock unit 110 is input to the high voltage switch 120.

The high voltage switch 120 outputs a selection signal SEL in response to a switch enable signal SWITCH_EN and the clock generated by the clock unit 110. The selection signal SEL is input to the gate of the NMOS transistor N1.

The first comparator COM1 compares a reference voltage REF and a comparison voltage Vcomp. When the comparison voltage Vcomp is higher than the reference voltage REF, the first comparator COM1 outputs a logic low signal. When the comparison voltage Vcomp is lower than the reference voltage REF, the first comparator COM1 outputs a logic high signal.

The NAND gate NA1 performs a NAND logic combination of the clock of the clock unit 110, a pump enable signal PUMP_EN, and the output signal of the first comparator COM1 and outputs a NAND logic combination result. In the NAND logic combination, when all the input signals are at a logic high level, a logic low signal is output. When any one of the input signals is at a logic low level, a logic high signal is output.

The output signal of the NAND gate NA1 is input to the first inverter IN1. The first to third inverters IN1 to IN3 are coupled in series between the output terminal of the NAND gate NA1 and the high voltage pump 130. Accordingly, the output signal of the NAND gate NA1 is inverted and delayed by the first to third inverters IN1 to IN3 and then input to one input terminal of the high voltage pump 130.

The first and fourth inverters IN1 and IN4 are coupled in series between the output terminal of the NAND gate NA1 and the other input terminal of the high voltage pump 130. Accordingly, the output signal of the NAND gate NA1 is delayed by the first and fourth inverters IN1 and IN4 and then input to the high voltage pump 130.

The high voltage pump 130 generates a high voltage in response to the signals output from the third inverter IN3 and the fourth inverter N4 and configured to have opposite phases. The high voltage output from the high voltage pump 130 is input to a high voltage input terminal HVIN.

The first and second resistors R1 and R2 are coupled in series between the high voltage input terminal HVIN and a ground node. The comparison voltage Vcomp, output from a node of the first and second resistors R1 and R2, is input to the first comparator COM1.

The NMOS transistor N1 is coupled between the high voltage input terminal HVIN and a high voltage output terminal HVOUT. The selection signal SEL output from the high voltage switch 120 is input to the gate of the NMOS transistor N1.

The capacitor C is coupled between the high voltage output terminal HVOUT and a ground node and is charged with an output voltage output as a high voltage.

In the above-described voltage generation circuit, only when the high voltage switch 120 is driven to output the selection signal SEL of a logic high level, a high voltage output from the high voltage pump 130 is sent to the high voltage output terminal HVOUT.

In this case, in the state in which the switch enable signal SWITCH_EN is input, the high voltage switch 120 outputs the selection signal SEL in response to the clock output from the clock unit 110. Accordingly, when the clock output from the clock unit 110 has a high frequency, the operating speed of the high voltage switch 120 becomes relatively fast, resulting in an increased operating current.

However, when the clock has a relatively low frequency, the operating speed of the high voltage switch 120 becomes relatively slow, resulting in a reduced operating current.

BRIEF SUMMARY

An embodiment relates to a high voltage generation circuit which is capable of, in a circuit configured to generate a high voltage, changing the frequency of a clock received according to an operating period, and a nonvolatile memory device including the same.

A high voltage generation circuit according to an embodiment includes a clock logic unit configured to generate a switch clock signal and a pump clock signal, that has a varying frequency, in response to an input signal, a high voltage unit configured to generate a high voltage in response to the pump clock signal, a high voltage switch configured to output a selection signal in response to the switch clock signal, and a switching element configured to transfer the high voltage, generated by the high voltage unit, to an output node in response to the selection signal.

The switch clock signal includes a first clock signal and a second clock signal having a frequency faster than that of the first clock signal, and the pump clock signal includes a third clock signal and a fourth clock signal having a frequency faster than that of the third clock signal.

The clock logic unit includes a switch clock unit configured to generate the first and second clock signals supplied to the switching element, and a pump clock unit configured to generate the third and fourth clock signals supplied to the high voltage unit.

The high voltage unit includes a pulse generation unit configured to generate the pump clock signal in the form of two clock pulses with opposite phases, and a charge pump configured to generate the high voltage in response to the two clock pulses output from the pulse generation unit.

The high voltage unit further includes a comparator configured to compare a reference voltage and a divided voltage of the high voltage output from the charge pump and control an input of the pump clock signal to the pulse generation unit based on the comparison result.

The switch clock unit includes a first comparison unit configured to compare a level of a reference voltage and a voltage level of the selection signal output from the high voltage switch and output a first control signal to control whether to generate a clock, and a first or second clock unit configured to generate the first or second clock signal according to a result of a logical combination of a switch enable signal, a clock enable signal, and the first control signal.

The pump clock unit includes a second comparison unit configured to compare a level of a reference voltage and a voltage level of the high voltage and output a second control signal to control whether to generate a clock, and a third or fourth clock unit configured to output the third or fourth clock signal according to a result of a logical combination of a clock enable signal, a pump enable signal, and the second control signal.

The first clock unit operates according to a result of a logical combination of the switch enable signal, the clock enable signal, and the first control signal, and the second clock unit operates according to a result of a logical combination of the switch enable signal, the clock enable signal, and an invert signal of the first control signal.

The third clock unit operates according to a result of a logical combination of the pump enable signal, the clock enable signal, and the second control signal. The fourth clock unit operates according to a result of a logical combination of the pump enable signal, the clock enable signal, and an invert signal of the second control signal.

If a voltage divided from the voltage level of the selection signal at a certain ratio is lower than the reference voltage, the first comparison unit outputs the first control signal having a first logic level which operates the first clock unit. If a voltage divided from the voltage level of the selection signal at a certain ratio is higher than the reference voltage, the first comparison unit outputs the first control signal having a second logic level which operates the second clock unit.

If a voltage divided from an output voltage output from the high voltage unit at a certain ratio is lower than the reference voltage, the second comparison unit outputs the second control signal having a first logic level which operates the third clock unit. If a voltage divided from an output voltage output from the high voltage unit at a certain ratio is higher than the reference voltage, the second comparison unit outputs the third control signal having a second logic level which operates the fourth clock unit.

A nonvolatile memory device according to another embodiment includes a memory cell array comprising memory cells for storing data, a page buffer unit, comprising page buffer circuits coupled to a bit line to which the memory cells of the memory cell array are coupled and configured to temporarily store data to be programmed into a selected memory cell or read data stored in the selected memory cell and store the read data, a voltage supply unit comprising a high voltage generation circuit configured to change a frequency of a clock signal that is input to generate an operating voltage for a program, read, or erase operation, according to an output voltage level, and a control unit configured to output a control signal for storing data in the memory cell array or reading data from the memory cell array and output enable control signals for enabling an operation of the high voltage generation circuit of the voltage supply unit.

The high voltage generation circuit of the voltage supply unit includes a clock logic unit configured to generate a switch clock signal and a pump clock signal that has a varying frequency, in response to an input signal, a high voltage unit configured to generate a high voltage in response to the pump clock signal, a high voltage switch configured to output a selection signal in response to the switch clock signal, and a switching element configured to transfer the high voltage, that is generated by the high voltage unit, to an output node in response to the selection signal.

The switch clock signal includes a first clock signal and a second clock signal having a frequency faster than that of the first clock signal, and the pump clock signal includes a third clock signal and a fourth clock signal having a frequency faster than that of the third clock signal.

The clock logic unit includes a switch clock unit configured to generate the first and second clock signals supplied to the switching element, and a pump clock unit configured to generate the third and fourth clock signals supplied to the high voltage unit.

The switch clock unit includes a first comparison unit configured to compare a level of a reference voltage and a voltage level of the selection signal output from the high voltage switch and output a first control signal to control whether to generate a clock, and a first or second clock unit configured to generate the first or second clock signal according to a result of a logical combination of a switch enable signal, a clock enable signal, and the first control signal.

The pump clock unit includes a second comparison unit configured to compare a level of a reference voltage and a voltage level of the high voltage and output a second control signal to control whether to generate a clock, and a third or fourth clock unit configured to output the third or fourth clock signal according to a result of a logical combination of a clock enable signal, a pump enable signal, and the second control signal.

The first clock unit operates according to a result of a logical combination of the switch enable signal, the clock enable signal, and the first control signal. The second clock unit operates according to a result of a logical combination of the switch enable signal, the clock enable signal, and an invert signal of the first control signal.

The third clock unit operates according to a result of a logical combination of the pump enable signal, the clock enable signal, and the second control signal. The fourth clock unit operates according to a result of a logical combination of the pump enable signal, the clock enable signal, and an invert signal of the second control signal.

If a voltage divided from the voltage level of the selection signal at a certain ratio is lower than the reference voltage, the first comparison unit outputs the first control signal having a first logic level which operates the first clock unit. If a voltage divided from the voltage level of the selection signal at a certain ratio is higher than the reference voltage, the first comparison unit outputs the first control signal having a second logic level which operates the second clock unit.

If a voltage divided from an output voltage output from the high voltage unit at a certain ratio is lower than the reference voltage, the second comparison unit outputs the second control signal having a first logic level which operates the third clock unit. If a voltage divided from an output voltage output from the high voltage unit at a certain ratio is higher than the reference voltage, the second comparison unit outputs the third control signal having a second logic level which operates the fourth clock unit.

DESCRIPTION OF SPECIFIC EMBODIMENT

Hereinafter, the present disclosure will be described in detail in connection with an embodiment with reference to the accompanying drawings. The drawing figures are provided to allow those having ordinary skill in the art to understand the scope of the embodiment of the disclosure.

Figure 2A:
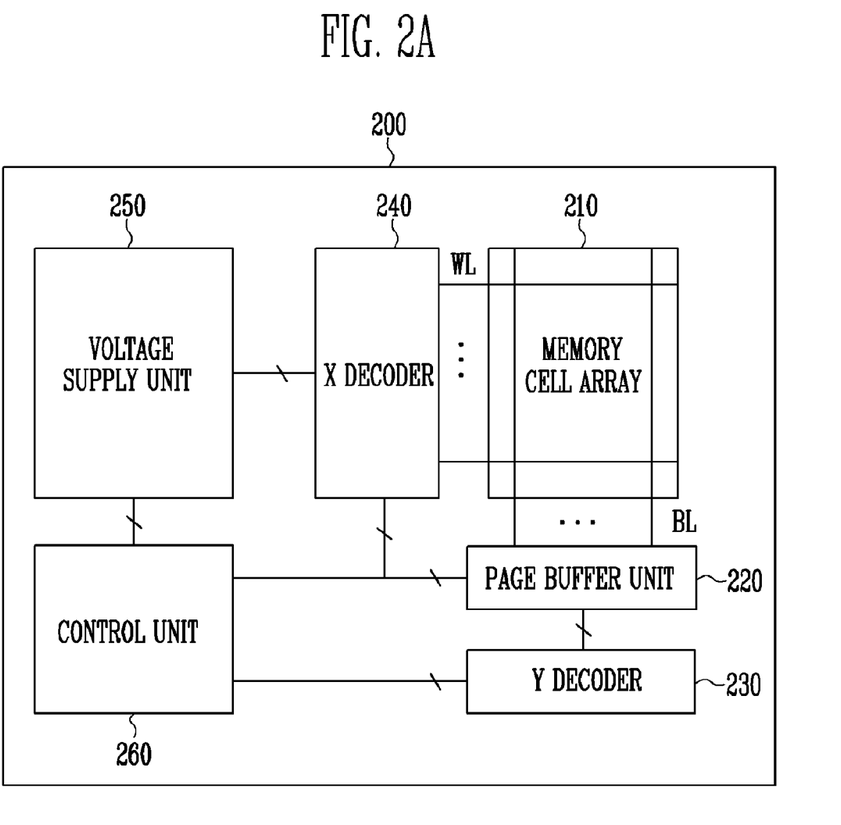
FIG. 2A is a block diagram of a nonvolatile memory device according to an embodiment.

FIG. 2A is a block diagram of a nonvolatile memory device according to an embodiment.

Referring to FIG. 2A, the nonvolatile memory device 200 includes a memory cell array 210, a page buffer unit 220, a Y decoder 230, an X decoder 240, a voltage supply unit 250, and a control unit 260.

The memory cell array 210 includes memory cells configured to be included in each block and store data. The memory cells included in each memory block are connected by a bit line and respective word lines and are available for being selected.

The page buffer unit 220 includes page buffer circuits coupled to the bit lines of the memory cell array 210. The page buffer circuit latches data to be programmed and then transmits the data to a selected bit line, or reads data, stored in a memory cell coupled to the selected bit line, and stores the read data.

The Y decoder 230 provides a data I/O path to the page buffer circuits of the page buffer unit 220. The X decoder 240 enables the memory block of the memory cell array 210 and couples the word line of the enabled memory block to a global word line for providing an operating voltage.

The voltage supply unit 250 generates the operating voltage provided to the global word line, and the control unit 260 controls the page buffer unit 220, the Y decoder 230, the X decoder 240, and the voltage supply unit 250.

The voltage supply unit 250 includes a high voltage generation circuit configured to pump an input voltage to a high voltage according to an input clock frequency and output the pumped high voltage.

Figure 2B:
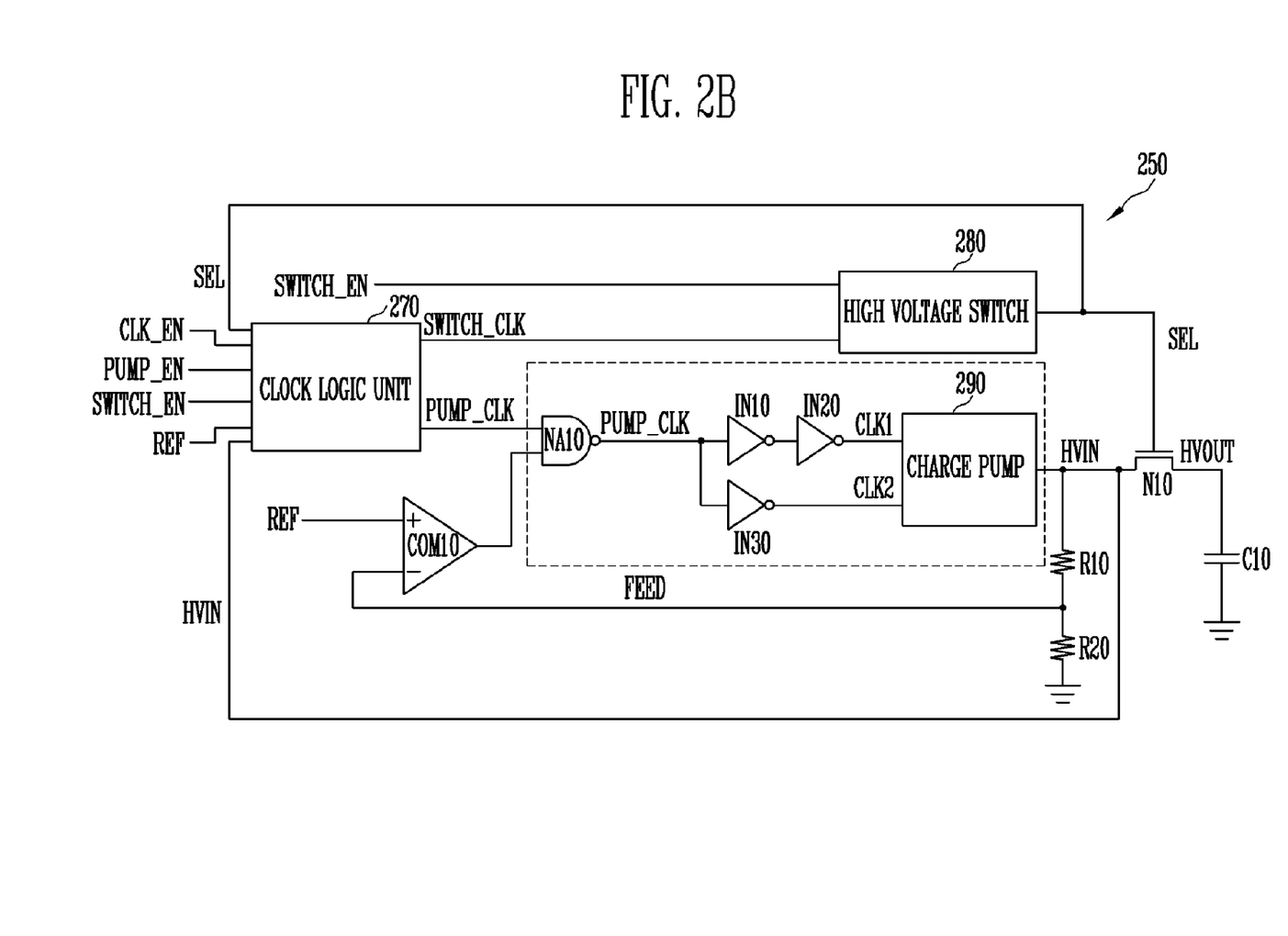
FIG. 2B shows only the high voltage generation circuit of a voltage supply unit shown in FIG. 2A.

FIG. 2A shows only the high voltage generation circuit of the voltage supply unit 250 of FIG. 2A.

Referring to FIG. 2B, the high voltage generation circuit of the high voltage supply unit 250 includes a clock logic unit 270, a high voltage switch 280, and a charge pump 290. The high voltage generation circuit further includes a first AND gate NA10, first to third inverters IN10 to IN30, a first comparator COM10, first and second resistors R10 and R20, an NMOS transistor N10, and a capacitor C10.

The first comparator COM10, the first to third inverters IN10 to IN30, and the charge pump 290 are included in a pump unit configured to generate a high voltage in response to a pump clock signal PUMP_CLK.

The clock logic unit 270 receives a clock enable signal CLK_EN, a pump enable signal PUMP_EN, a switch enable signal SWITCH_EN, a reference voltage REF, a selection signal SEL output from the high voltage switch 280, and a high voltage input to a high voltage input terminal HVIN, and outputs a switch clock signal SWITCH_CLK and a pump clock signal PUMP_CLK.

The high voltage switch 280 outputs the selection signal SEL in response to the switch enable signal SWITCH_EN and the switch clock signal SWITCH_CLK. Furthermore, the charge pump 290 pumps voltage to a high voltage according to a first clock CLK1, being the result of the pump clock signal PUMP_CLK input via the first and second inverters IN10 and IN20, and a second clock CLK2 being the result of the pump clock signal PUMP_CLK input via the third inverter IN30. The high voltage output from the charge pump 290 is input to the high voltage input terminal HVIN.

The first AND gate NA10 receives the pump clock signal PUMP_CLK from the clock logic unit 270 and an output signal from the first comparator COM10. The first AND gate NA10 outputs the pump clock signal PUMP_CLK without change when the output signal of the first comparator COM10 is at a logic high level.

A reference voltage REF and a feedback voltage FEED are input to the first comparator COM10. The reference voltage REF is input to the non-inverting terminal (+) of the first comparator COM10, and the feedback voltage FEED is input to the inverting terminal (−) of the first comparator COM10. The first comparator COM10 outputs a logic high signal when the reference voltage REF is higher than the feedback voltage FEED and outputs a logic low signal when the reference voltage REF is lower than the feedback voltage FEED.

The output of the first AND gate NA10 becomes the first clock CLK1 delayed by the first and second inverters IN10 and IN20, and the output of the first AND gate NA10 becomes the second clock CLK2 inverted by the third inverter IN30.

The first and second clocks CLK1 and CLK2 are inverse signals and have a different degree of delay.

Meanwhile, the feedback voltage FEED is a voltage divided by the first and second resistors R10 and R20 in series coupled between the high voltage input terminal HVIN and a ground node. That is, the high voltage output from the charge pump 290 is divided by the first and second resistors R10 and R20, thereby becoming the feedback voltage FEED.

Accordingly, the first comparator COM10 functions to control the input of the pump clock signal PUMP_CLK so that the level of voltage output from the charge pump 290 is constant.

The NMOS transistor N10 is coupled between the high voltage input terminal HVIN and a high voltage output terminal HVOUT. The selection signal SEL output from the high voltage switch 280 is input to the gate of the NMOS transistor N10. The capacitor C10 is coupled between the high voltage output terminal HVOUT and a ground node.

In the above-described high voltage generation circuit, the high voltage switch 280 and the charge pump 290 are controlled in response to the switch clock signal SWITCH_CLK and the pump clock signal PUMP_CLK output from the clock logic unit 270.

Here, the clock logic unit 270 selectively outputs high and low frequency clock signals in response to the selection signal SEL, output from the high voltage switch 280, and the voltage level of the high voltage HVIN output from the charge pump 290.

Figure 2C:
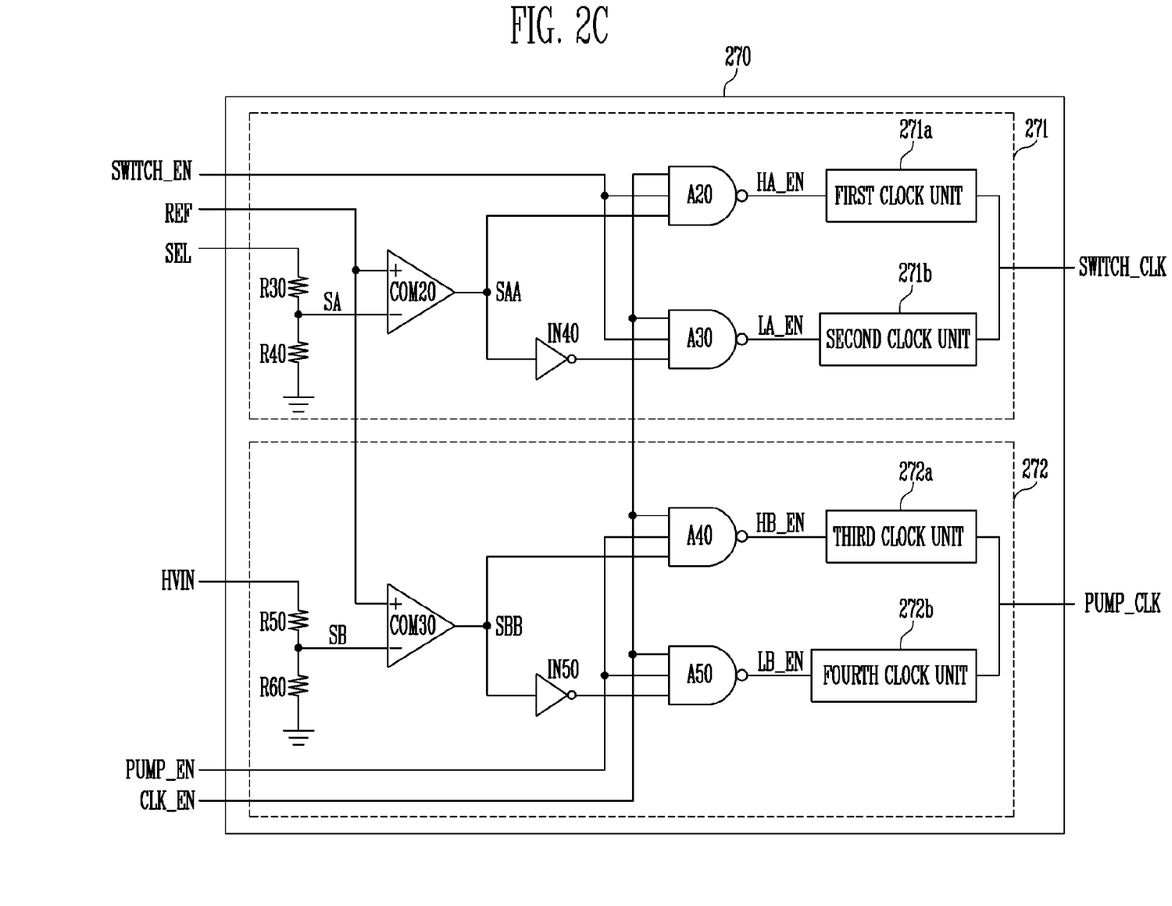
FIG. 2C shows a clock logic unit of FIG. 2B.

FIG. 2C shows the clock logic unit 270 of FIG. 2B.

Referring to FIG. 2C, the clock logic unit 270 includes a switch clock unit 271 and a pump clock unit 272. The switch clock unit 271 includes first and second clock units 271a and 271b, third and fourth resistors R30 and R40, a second comparator COM20, a fourth inverter IN40, and second and third AND gates A20 and A30.

The pump clock unit 272 includes third and fourth clock units 272a and 272b, fifth and sixth resistors R50 and R60, a third comparator COM30, a fifth inverter IN50, and fourth and fifth AND gates A40 and A50.

The switch clock unit 271 generates the switch clock signal SWITCH_CLK, and the pump clock unit 272 generates the pump clock signal PUMP_CLK.

The third and fourth resistors R30 and R40 are coupled in series between a ground node and an input terminal to which the selection signal SEL is input. A node SA of the third resistor R30 and the fourth resistor R40 is coupled to the inverting terminal (−) of the second comparator COM20. Furthermore, the reference voltage REF is input to the non-inverting terminal (+) of the second comparator COM20.

The output terminal of the second comparator COM20 is coupled to a node SAA. The node SAA is coupled to the second AND gate A20. The switch enable signal SWITCH_EN and the clock enable signal CLK_EN are input to the second AND gate A20.

The fourth inverter IN40 inverts a signal of the node SAA and outputs an inverted signal. The output signal of the fourth inverter IN40 is input to the third AND gate A30. The switch enable signal SWITCH_EN and the clock enable signal CLK_EN are input to the third AND gate A30.

The output signal of the second AND gate A20 is a first high frequency enable signal HA_EN, and the output signal of the third AND gate A30 is a first low frequency enable signal LA_EN.

The first high frequency enable signal HA_EN is input to the first clock unit 271a, and the first low frequency enable signal LA_EN is input to the second clock unit 271b.

The first clock unit 271a outputs a high frequency clock, and the second clock unit 271b outputs a relatively low frequency clock. Only any one of the first and second clock units 271a and 271b outputs a clock signal. Furthermore, a clock output from the first and second clock units 271a and 271b is the switch clock signal SWITCH_CLK.

The fifth and sixth resistors R50 and R60 are coupled in series between a ground node and the high voltage input terminal HVIN to which the high voltage output from the charge pump 290 is input. A node SB of the fifth resistor R50 and the sixth resistor R60 is coupled to an inverting terminal (−) of the third comparator COM30. The reference voltage REF is input to the non-inverting terminal (+) of the third comparator COM30.

The output terminal of the third comparator COM30 is coupled to a node SBB. The node SBB is coupled to the fourth AND gate A40. Furthermore, the pump enable signal PUMP_EN and the clock enable signal CLK_EN are input to the fourth AND gate A40.

The fifth inverter IN50 inverts a signal of the node SBB and outputs an inverted signal. The output signal of the fifth inverter IN50 is input to the fifth AND gate A50. Furthermore, the pump enable signal PUMP_EN and the clock enable signal CLK_EN are input to the fifth AND gate A50.

The output signal of the fourth AND gate A40 is a second high frequency enable signal HB_EN, and the output signal of the fifth AND gate A50 is a second low frequency enable signal LB_EN.

The second high frequency enable signal HB_EN is input to the third clock unit 272a, and the second low frequency enable signal LB_EN is input to the fourth clock unit 272b.

The third clock unit 272a outputs a high frequency clock in response to the second high frequency enable signal HB_EN, and the fourth clock unit 272b outputs a relatively low frequency clock signal in response to the second low frequency enable signal LB_EN. Here, only any one of the third and fourth clock units 272a and 272b operates, and a clock signal output from the third and fourth clock units 272a and 272b is the pump clock signal PUMP_CLK.

An operation of the high voltage generation circuit, outputting a high voltage in response to the output of the clock logic unit 270, is described below.

Figure 3:
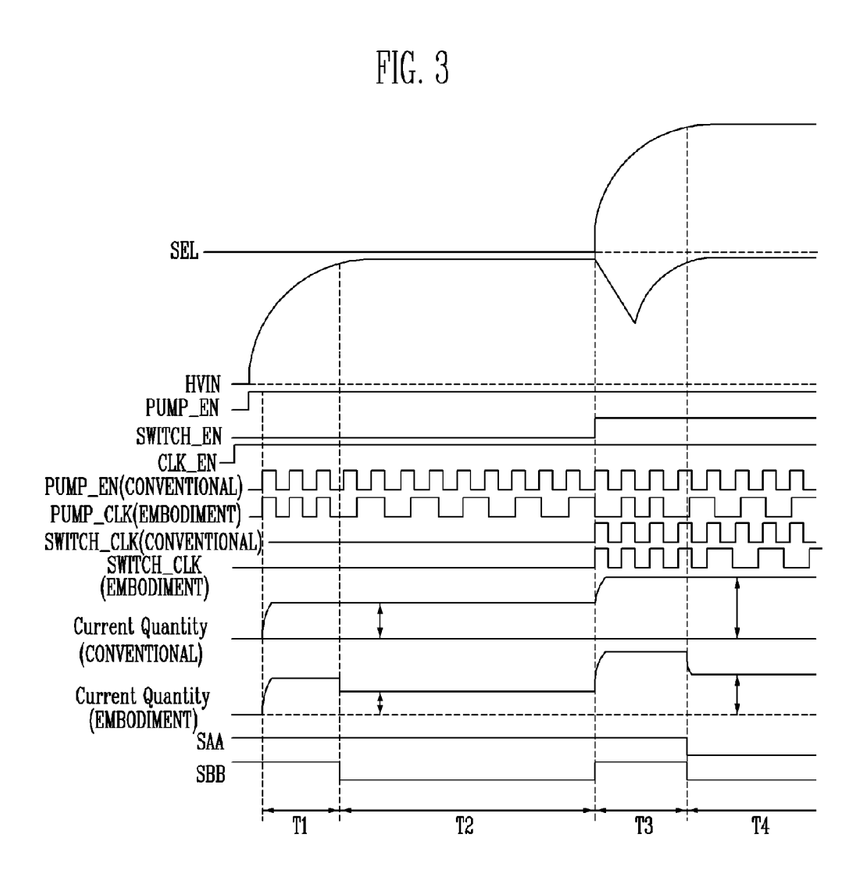
FIG. 3 is a timing diagram illustrating an operation of the high voltage generation circuit according to an embodiment.

FIG. 3 is a timing diagram illustrating an operation of the high voltage generation circuit according to an embodiment.

Here, a timing diagram of signals generated by an existing high voltage generation circuit is also shown in FIG. 3 in order to describe a difference between the existing high voltage generation circuit and the high voltage generation circuit according to an embodiment.

Referring to FIG. 3, the high voltage generation circuit operates in response to the clock enable signal CLK_EN and the pump enable signal PUMP_EN both of which are at a logic high level.

When the clock enable signal CLK_EN and the pump enable signal PUMP_EN that are both at a logic high level are input, the clock logic unit 270 operates as follows.

When an operation starts, the reference voltage REF is input to the clock logic unit 270. When the reference voltage REF is input to the clock logic unit 270, the second and third comparators COM20 and COM30 output logic high signals. During the initial operation, the selection signal SEL or a high voltage is not output. Thus, the second and third comparators COM20 and COM30 output logic high signals according to the reference voltage REF.

Accordingly, the node SAA and the node SBB become a logic high level.

Furthermore, when the clock enable signal CLK_EN and the pump enable signal PUMP_EN are input as a logic high level, the fourth AND gate A40 outputs the second high frequency enable signal HB_EN. When the second high frequency enable signal HB_EN is output, the third clock unit 272a generates a high frequency clock and outputs it as the pump clock signal PUMP_CLK.

When the pump clock signal PUMP_CLK of a high frequency is input, voltage output from the charge pump 290 rises relatively slowly. This is illustrated in the period T1 of FIG. 3. When the high voltage output from the charge pump 290 becomes a certain level, the voltage level of the node SB becomes higher than the reference voltage REF.

When the voltage level of the node SB becomes higher than the reference voltage REF, the third comparator COM30 outputs a logic low signal. When the third comparator COM30 outputs a logic low signal, the node SBB becomes a logic low level, and the fourth AND gate A40 outputs the second high frequency enable signal HB_EN of a logic low level.

However, the fifth AND gate A50 outputs the second low frequency enable signal LB_EN of a logic high level. When the second low frequency enable signal LB_EN shifts to a logic high level, the fourth clock unit 272b operates and outputs the pump clock signal PUMP_CLK of a relatively low frequency. At this time, the third clock unit 272a does not operate in response to the second high frequency enable signal HB_EN of a logic low level.

Accordingly, once the high voltage output from the charge pump 290 has risen to a certain level, the charge pump 290 generates a high voltage maintaining the certain level although the pump clock signal PUMP_CLK is input to a relatively low frequency. Accordingly, during the period T1 in which voltage has to be initially pumped to a high voltage rapidly, the pump clock signal PUMP_CLK of a high frequency is applied. During a stable period T2, the pump clock signal PUMP_CLK of a relatively low frequency is applied.

In the above-described operation, it can be seen that the current quantity of the embodiment in which a clock of a high frequency is applied only during the period T1 where the voltage initially rises and, subsequently, the clock changes to a relatively low frequency is smaller than that of the existing high voltage generation circuit in which only a clock of a high frequency is input.

Next, in order to transfer the high voltage, supplied to the high voltage input terminal HVIN, to the high voltage output terminal HVOUT and output it as an operating voltage, the switch enable signal SWITCH_EN of a logic high level is supplied.

The second comparator COM20 outputs a logic high signal based on the reference voltage REF. Furthermore, when the switch enable signal SWITCH_EN and the clock enable signal CLK_EN are input as a logic high level, the second AND gate A20 outputs the first high frequency enable signal HA_EN of a logic high level. At this time, the third AND gate A30 outputs the first low frequency enable signal LA_EN of a logic low level.

When the first high frequency enable signal HA_EN is at a logic high level, the first clock unit 271a operates and outputs the switch clock signal SWITCH_CLK of a high frequency. Furthermore, when the voltage level of the selection signal SEL rises to a certain level, the voltage of the node SA becomes higher than the reference voltage REF, so the output of the second comparator COM20 shifts to a logic low level.

When the output of the second comparator COM20 shifts a logic low level, the second AND gate A20 outputs the first high frequency enable signal HA_EN of a logic low level, and the third AND gate A30 outputs the first low frequency enable signal LA_EN of a logic high level.

When the first low frequency enable signal LA_EN shifts to a logic high level, the second clock unit 271b outputs the switch clock signal SWITCH_CLK of a relatively low frequency.

When the high frequency switch clock signal SWITCH_CLK is input, the voltage level of the selection signal SEL output from the high voltage switch 280 relatively slowly rises. This period corresponds to a period T3.

During the period T3, the NMOS transistor N10 is relatively slowly turned on in response to the selection signal SEL having a relatively slowly rising voltage level. When the NMOS transistor N10 is relatively slowly turned on, the voltage of the high voltage input terminal HVIN gradually flows into the high voltage output terminal HVOUT, so the voltage level of the high voltage input terminal HVIN relatively slowly drops and then rises.

When the voltage level of the high voltage input terminal HVIN drops to a certain level, the voltage level of the node SB of the clock logic unit 270 also drops. When the voltage level of the node SB becomes lower than the reference voltage REF, the voltage level of the node SBB shifts to a logic high level.

When the node SBB is at a logic high level, the fourth AND gate A40 outputs the second high frequency enable signal HB_EN of a logic high level and the fifth AND gate A50 outputs the second low frequency enable signal LB_EN of a logic low level, as in the period T1.

When the second high frequency enable signal HB_EN of a logic high level is output, the third clock unit 272a outputs the pump clock signal PUMP_CLK having a high frequency so that the charge pump 290 raises the voltage level again.

If, after the period T3, the charge pump 290 operates and the voltage level of the high voltage input terminal HVIN is stabilized again, the fourth AND gate A40 outputs the second high frequency enable signal HB_EN of a logic low level, and the fifth AND gate A50 outputs the second low frequency enable signal LB_EN of a logic high level. Accordingly, after the voltage level of the high voltage input terminal HVIN is stabilized, the low frequency pump clock signal PUMP_CLK is output.

According to the above-described operation, during the period in which the pump voltage is to be raised to a desired voltage level, where the pump clock signal PUMP_EN is controlled so that it shifts to a high frequency or a relatively low frequency, the high frequency pump clock signal PUMP_CLK is output. In the state in which the voltage level of the high voltage input terminal HVIN is stabilized, the low frequency pump clock signal PUMP_CLK is output. Accordingly, unnecessary current consumption can be reduced, and a speed at which a high voltage is generated is not affected.

As described above, according to the high voltage generation circuit and the nonvolatile memory device including the same, when a high voltage is generated, a clock frequency is changed so that it is suitable for each operation period. Accordingly, the operating speed can become relatively fast and unnecessary current consumption can be reduced.

What is claimed is:

1. A high voltage generation circuit, comprising:
    a clock logic unit configured to generate a switch clock signal and a pump clock signal, that has a varying frequency, in response to an input signal;
    a high voltage unit configured to generate a high voltage in response to the pump clock signal;
    a high voltage switch configured to output a selection signal in response to the switch clock signal; and
    a switching element configured to transfer the high voltage, generated by the high voltage unit, to an output node in response to the selection signal
    wherein the switch clock signal comprises a first clock signal and a second clock signal having a frequency faster than that of the first clock signal and the pump clock signal comprises a third clock signal and a fourth clock signal having a frequency faster than that of the third clock signal.

2. The high voltage generation circuit of claim 1, wherein the clock logic unit comprises:
    a switch clock unit configured to generate the first and second clock signals supplied to the switching element; and
    a pump clock unit configured to generate the third and fourth clock signals supplied to the high voltage unit.

3. The high voltage generation circuit of claim 2, wherein the high voltage unit comprises:
    a pulse generation unit configured to generate the pump clock signal in the form of two clock pulses with opposite phases; and
    a charge pump configured to generate the high voltage in response to the two clock pulses output from the pulse generation unit.

4. The high voltage generation circuit of claim 3, wherein the high voltage unit further comprises a comparator configured to compare a reference voltage and a divided voltage of the high voltage output from the charge pump and control an input of the pump clock signal to the pulse generation unit based on the comparison result.

5. The high voltage generation circuit of claim 2, wherein the switch clock unit comprises:
    a first comparison unit configured to compare a level of a reference voltage and a voltage level of the selection signal output from the high voltage switch and output a first control signal to control whether to generate a clock; and a first or second clock unit configured to generate the first or second clock signal according to a result of a logical combination of a switch enable signal, a clock enable signal, and the first control signal.

6. The high voltage generation circuit of claim 2, wherein the pump clock unit comprises:
a second comparison unit configured to compare a level of a reference voltage and a voltage level of the high voltage and output a second control signal to control whether to generate a clock; and
a third or fourth clock unit configured to output the third or fourth clock signal according to a result of a logical combination of a clock enable signal, a pump enable signal, and the second control signal.

7. The high voltage generation circuit of claim 5, wherein:
the first clock unit operates according to a result of a logical combination of the switch enable signal, the clock enable signal, and the first control signal, and
the second clock unit operates according to a result of a logical combination of the switch enable signal, the clock enable signal, and an invert signal of the first control signal.

8. The high voltage generation circuit of claim 6, wherein:
the third clock unit operates according to a result of a logical combination of the pump enable signal, the clock enable signal, and the second control signal, and
the fourth clock unit operates according to a result of a logical combination of the pump enable signal, the clock enable signal, and an invert signal of the second control signal.

9. The high voltage generation circuit of claim 5, wherein:
if a voltage divided from the voltage level of the selection signal at a certain ratio is lower than the reference voltage, the first comparison unit outputs the first control signal having a first logic level which operates the first clock unit, and
if a voltage divided from the voltage level of the selection signal at a certain ratio is higher than the reference voltage, the first comparison unit outputs the first control signal having a second logic level which operates the second clock unit.

10. The high voltage generation circuit of claim 6, wherein:
if a voltage divided from an output voltage output from the high voltage unit at a certain ratio is lower than the reference voltage, the second comparison unit outputs the second control signal having a first logic level which operates the third clock unit, and
if a voltage divided from an output voltage output from the high voltage unit at a certain ratio is higher than the reference voltage, the second comparison unit outputs the third control signal having a second logic level which operates the fourth clock unit.

11. A nonvolatile memory device, comprising:
a memory cell array comprising memory cells for storing data;
a page buffer unit comprising page buffer circuits coupled to a bit line to which the memory cells of the memory cell array are coupled and configured to temporarily store data to be programmed into a selected memory cell or read data stored in the selected memory cell and store the read data;
a high voltage generation circuit comprises:
a clock logic unit configured to generate a switch clock signal and a pump clock signal, that has a varying frequency, in response to an input signal, wherein the switch clock signal comprises a first clock signal and a second clock signal having a frequency faster than that of the first clock signal and the pump clock signal comprises a third clock signal and a fourth clock signal having a frequency faster than that of the third clock signal,
a high voltage unit configured to generate a high voltage in response to the pump clock signal,
a high voltage switch configured to output a selection signal in response to the switch clock signal, and
a switching element configured to transfer the high voltage, generated by the high voltage unit, to an output node in response to the selection signal; and
a control unit configured to output a control signal for storing data in the memory cell array or reading data from the memory cell array and output enable control signals for enabling an operation of the high voltage generation circuit.

12. The nonvolatile memory device of claim 11, wherein the clock logic unit comprises:
a switch clock unit configured to generate the first and second clock signals supplied to the switching element; and
a pump clock unit configured to generate the third and fourth clock signals supplied to the high voltage unit.

13. The nonvolatile memory device of claim 12, wherein the switch clock unit comprises:
a first comparison unit configured to compare a level of a reference voltage and a voltage level of the selection signal output from the high voltage switch and output a first control signal to control whether to generate a clock; and
a first or second clock unit configured to generate the first or second clock signal according to a result of a logical combination of a switch enable signal, a clock enable signal, and the first control signal.

14. The nonvolatile memory device of claim 13, wherein the pump clock unit comprises:
a second comparison unit configured to compare a level of a reference voltage and a voltage level of the high voltage and output a second control signal to control whether to generate a clock; and
a third or fourth clock unit configured to output the third or fourth clock signal according to a result of a logical combination of a clock enable signal, a pump enable signal, and the second control signal.

15. The nonvolatile memory device of claim 13, wherein:
the first clock unit operates according to a result of a logical combination of the switch enable signal, the clock enable signal, and the first control signal, and
the second clock unit operates according to a result of a logical combination of the switch enable signal, the clock enable signal, and an invert signal of the first control signal.

16. The nonvolatile memory device of claim 14, wherein:
the third clock unit operates according to a result of a logical combination of the pump enable signal, the clock enable signal, and the second control signal, and
the fourth clock unit operates according to a result of a logical combination of the pump enable signal, the clock enable signal, and an invert signal of the second control signal.

17. The nonvolatile memory device of claim 13, wherein:
if a voltage divided from the voltage level of the selection signal at a certain ratio is lower than the reference voltage, the first comparison unit outputs the first control signal having a first logic level which operates the first clock unit, and if a voltage divided from the voltage level of the selection signal at a certain ratio is higher than the reference voltage, the first comparison unit outputs the first control signal having a second logic level which operates the second clock unit.

18. The nonvolatile memory device of claim 14, wherein:
if a voltage divided from an output voltage output from the high voltage unit at a certain ratio is lower than the reference voltage, the second comparison unit outputs the second control signal having a first logic level which operates the third clock unit, and
if a voltage divided from an output voltage output from the high voltage unit at a certain ratio is higher than the reference voltage, the second comparison unit outputs the third control signal having a second logic level which operates the fourth clock unit.

19. The nonvolatile memory device of claim 11, wherein the high voltage unit comprises:
a pulse generation unit configured to generate the pump clock signal in the form of two clock pulses with opposite phases; and
a charge pump configured to generate the high voltage in response to the two clock pulses output from the pulse generation unit.

20. The nonvolatile memory device of claim 19, wherein the high voltage unit further comprises comparison means configured to compare a reference voltage and a divided voltage of the high voltage output from the charge pump and control an input of the pump clock signal to the pulse generation unit based on the comparison result.

* * * * *